United States Patent
Yang

(10) Patent No.: US 11,885,831 B2
(45) Date of Patent: Jan. 30, 2024

(54) FIXTURE

(71) Applicants: Beijing BOE Chatani Electronics Co., Ltd., Beijing (CN); BOE Technology Group Co., Ltd., Beijing (CN)

(72) Inventor: Yingqiu Yang, Beijing (CN)

(73) Assignees: Beijing BOE Chatani Electro Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 218 days.

(21) Appl. No.: 17/489,559

(22) Filed: Sep. 29, 2021

(65) Prior Publication Data

US 2022/0137096 A1    May 5, 2022

(30) Foreign Application Priority Data

Nov. 5, 2020 (CN) .......................... 202022540105.X

(51) Int. Cl.
  *G01R 1/10*   (2006.01)
  *G01R 1/073*   (2006.01)
  *G01R 31/28*   (2006.01)

(52) U.S. Cl.
  CPC ........... *G01R 1/10* (2013.01); *G01R 1/07328* (2013.01); *G01R 31/2882* (2013.01)

(58) Field of Classification Search
  None
  See application file for complete search history.

(56) References Cited

FOREIGN PATENT DOCUMENTS

| CN | 202649405 U | * | 1/2013 | |
|---|---|---|---|---|
| CN | 207051322 U | * | 2/2018 | |
| CN | 215067125 U | * | 12/2021 | |
| CN | 215641655 U | * | 1/2022 | |
| CN | 216310609 U | * | 4/2022 | |
| CN | 216486407 U | * | 5/2022 | |
| CN | 217032424 U | * | 7/2022 | |
| CN | 217467647 U | * | 9/2022 | |
| CN | 217588048 U | * | 10/2022 | |
| CN | 105929321 B | * | 3/2023 | ......... G01R 31/2891 |
| CN | 219512332 U | * | 8/2023 | |

* cited by examiner

Primary Examiner — Jermele M Hollington
(74) Attorney, Agent, or Firm — IPro, PLLC

(57) ABSTRACT

Disclosed is a fixture including: a base including a bearing surface for bearing a T-CON board, and a limit mechanism for limiting displacement of the T-CON board in a direction parallel to the bearing surface; and a probe assembly for jointing with an upgrading lead port of the T-CON board, wherein the probe assembly is installed on the base and has an adjustable relative position with the bearing surface in a direction perpendicular to the bearing surface. When in upgrading, the T-CON board is arranged on the bearing surface of the base firstly, the position of the T-CON board is fixed by the limit mechanism, and the probe assembly is aligned with the upgrading lead port of the T-CON board, and is adjusted and moved in the direction perpendicular to the bearing surface so as to joint with the upgraded lead port of the T-CON board.

8 Claims, 2 Drawing Sheets

FIXTURE

CROSS-REFERENCE TO RELATED APPLICATION

This application is based on and claims priority under 35 U.S.C 119 to Chinese Patent Application No. 202022540105.X, filed on Nov. 5, 2020, in the China National Intellectual Property Administration. The entire disclosure of the above application is incorporated herein by reference.

FIELD

The disclosure relates to the technical field of circuit boards, in particular to a fixture.

BACKGROUND

As liquid crystal display technology matures, people have different display requirements for modules, and when the modules are produced, programs of a T-CON board (Timing-controller board) used are different for different customers, so that the T-CON board needs to be upgraded after being received.

Most upgrading modes in the related art are as follows: an operator holds a fixture with a probe, inserts the probe into an upgrading lead port of the T-CON board to allow the probe and the T-CON board to joint so as to perform upgrading.

SUMMARY

The disclosure provides the following technical solutions.

A fixture for procedural upgrading of a T-CON board includes: a base including a bearing surface for bearing the T-CON board, and a limit mechanism for limiting displacement of the T-CON board in a direction parallel to the bearing surface; and a probe assembly for jointing with an upgrading lead port of the T-CON board, and installed on the base, wherein the probe assembly has an adjustable relative position with the bearing surface in a direction perpendicular to the bearing surface.

Optionally, the probe assembly includes a fixing plate and a probe installed on the fixing plate, wherein the fixing plate has an adjustable relative position with the bearing surface in the direction perpendicular to the bearing surface, and the probe is jointed with the upgrading lead ports of the T-CON board.

Optionally, the fixing plate is provided with containing holes for containing the probes; and the probe is a telescoping lead probe.

Optionally, the fixture further includes a guide assembly; and the guide assembly is installed on the base and is configured to drive the fixing plate and the probe to move relative to the bearing surface in the direction perpendicular to the bearing surface.

Optionally, the guide assembly includes a guide rail and a slider; the slider is fixedly connected to the fixing plate; an extension direction of the guide rail is perpendicular to the bearing surface; and the slider is installed on the guide rail in a sliding manner in the extension direction of the guide rail.

Optionally, the guide assembly further includes a retainer; the retainer is fixedly installed on the base; and the guide rail is fixedly installed on the retainer.

Optionally, the base includes a bottom plate and three side plates; a surface, being close to the guide assembly, of the bottom plate is the bearing surface; the three side plates are each perpendicular to the bottom plate, and the bottom plate and the three side plates are joined to form the limit mechanism.

Optionally, the base further includes a connecting plate and a support plate; the connecting plate is fixedly connected to any two adjacent side plates; the support plate is positioned on a side, facing away from the bottom plate, of the connecting plate, and includes strip-shaped holes, and is fixedly connected to the connecting plate by bolts matched with the strip-shaped holes; planes where the connecting plate and the support plate are located are both parallel to the bearing surface; and the retainer is fixedly installed on the support plate.

Optionally, the guide assembly further includes a locking mechanism; and the locking mechanism serves to limit displacement of the slider in the direction perpendicular to the bearing surface.

Optionally, the locking mechanism includes a first locking block and a second locking block; the first locking block is fixedly connected to the slider, and includes a first magnet; the second locking block is fixedly connected to an end, away from the base, of the retainer, and includes a second magnet; and the first magnet and the second magnet are arranged correspondingly.

DETAILED DESCRIPTION OF THE EMBODIMENTS

The technical solutions in the embodiments of the disclosure will be clearly and completely described below in conjunction with the accompanying drawings in the embodiments of the disclosure, and it will be apparent that the embodiments described are only a part of the embodiments, instead of all the embodiments of the disclosure. Based on the embodiments in the disclosure, all other embodiments obtained by those of ordinary skill in the art without creative efforts fall within the scope of protection of the disclosure.

Figure 1:
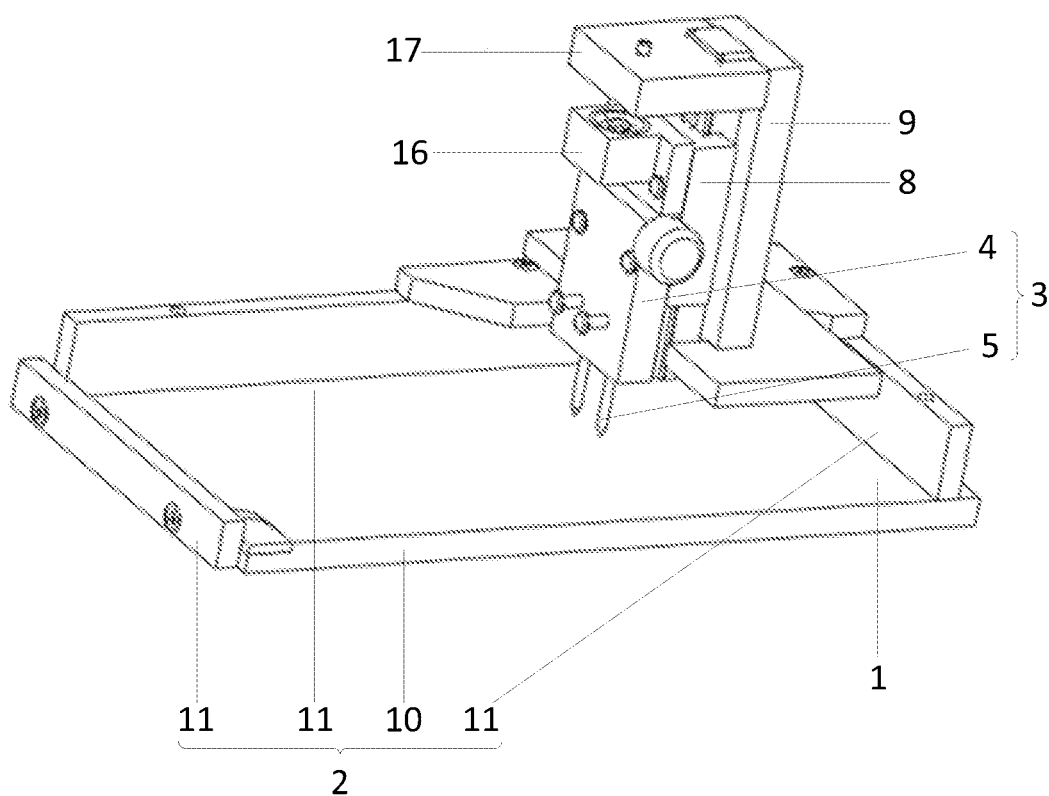
FIG. 1 is a structural schematic diagram of a fixture provided by an embodiment of the disclosure.

FIG. 1 is a structural schematic diagram of a fixture provided by an embodiment of the disclosure. As shown in FIG. 1, the fixture provided by the embodiment of the disclosure is used for procedural upgrading of a T-CON board, and includes: a base including a bearing surface 1 for bearing the T-CON board, and a limit mechanism 2 for limiting displacement of the T-CON board in a direction parallel to the bearing surface 1; a probe assembly 3 for jointing with an upgrading lead port of the T-CON board, wherein the probe assembly 3 is installed on the base and has an adjustable relative position with the bearing surface 1 in a direction perpendicular to the bearing surface 1.

According to the fixture provided by some embodiments, when procedural upgrading is required for the T-CON board, the T-CON board is arranged on the bearing surface 1 of the base firstly, the position of the T-CON board is fixed by the limit mechanism 2, meanwhile, the condition that probes 5 are aligned with upgrading lead ports of the T-CON board is guaranteed, then the probe assembly 3 is adjusted and moved in the direction perpendicular to the bearing surface 1 to joint with the upgrading lead port of the T-CON board, and the probe assembly 3 is removed after upgrading is finished.

According to this arrangement mode, manual operation by an operator is not needed, after the position of the T-CON board is determined by the limit mechanism 2, the probe assembly 3 only needs to be adjusted in the direction perpendicular to the bearing surface 1 to joint with the upgrading lead port of the T-CON board and then upgrading is performed. Since the probe assembly 3 is installed on the base, the probe assembly remains stable in the upgrading process to avoid the phenomenon of a poor contact between the probe assembly 3 and the T-CON board caused by wobbling, so that an upgrading success rate of the T-CON board is increased.

Figure 2:
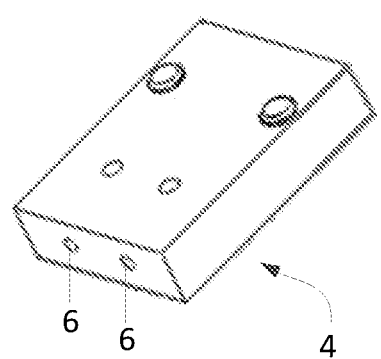
FIG. 2 is a structural schematic diagram of a fixing plate provided by an embodiment of the disclosure.

FIG. 2 is a structural schematic diagram of a fixing plate provided by an embodiment of the disclosure. With reference to FIGS. 1 and 2, as an optional embodiment, the probe assembly 3 includes a fixing plate 4 and the probes 5 installed on the fixing plate 4, wherein the fixing plate 4 has an adjustable relative position with the bearing surface 1 in the direction perpendicular to the bearing surface, and the probes 5 are jointed with the upgrading lead ports of the T-CON board. The fixing plate 4 is provided with containing holes 6 for containing the probes 5; and the probes telescoping lead probes.

In some embodiments, since the probes 5 are telescoping lead probes, the probes can telescope in the containing holes 6, and when the probes 5 are successfully jointed with the upgrading lead ports of the T-CON board, the fixing plate 4 moves under its own gravity towards the bearing surface 1, and at the moment, one ends of the probes 5 retract into the containing holes 6 by a certain distance.

According to this arrangement mode, since one ends of the probes 5 are jointed with the upgrading lead ports of the T-CON board, and the other ends of the probes 5 retract into the containing holes 6, the stability of the probes 5 is improved, and a non-gap contact between the probes 5 and the upgrading lead ports of the T-CON board in the upgrading process can be further guaranteed.

As an optional embodiment, the fixture further includes a guide assembly; and the guide assembly is installed on the base and configured to drive the fixing plate 4 and the probes 5 to move relative to the bearing surface 1 in the direction perpendicular to the bearing surface 1.

In some embodiments, the guide assembly may be a telescopic rod which is connected to the fixing plate 4 to move the probes 5.

Figure 3:
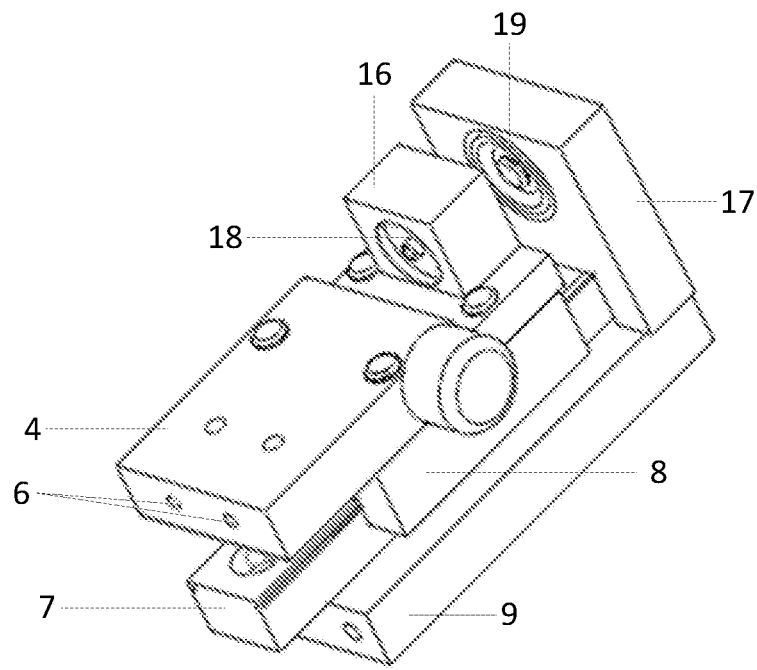
FIG. 3 is a structural schematic diagram of cooperative installation of a guide assembly and a probe assembly provided by an embodiment of the disclosure.

FIG. 3 is a structural schematic diagram of cooperative installation of the guide assembly and the probe assembly provided by an embodiment of the disclosure. With reference to FIG. 1 and FIG. 3, as an optional embodiment, the guide assembly includes a guide rail 7 and a slider 8; the slider 8 is fixedly connected to the fixing plate 4; an extension direction of the guide rail 7 is perpendicular to the bearing surface 1; and the slider 8 is installed on the guide rail 7 in a sliding manner in the extension direction of the guide rail 7. The guide assembly further includes a retainer 9 which is fixedly installed on the base; and the guide rail 7 is fixedly installed on the retainer 9.

In some embodiments, since the extension direction of the guide rail 7 is perpendicular to the bearing surface 1, the slider 8 only needs to slide in the extension direction of the guide rail 7 to drive the fixing plate and the probes 5 to move relative to the bearing surface 1 in the direction perpendicular to the bearing surface.

Extension directions of the probes 5 are set to be parallel to the extension direction of the guide rail 7 to fulfill that the probes 5 can be successfully jointed with the upgrading lead ports of the T-CON board.

Figure 4:
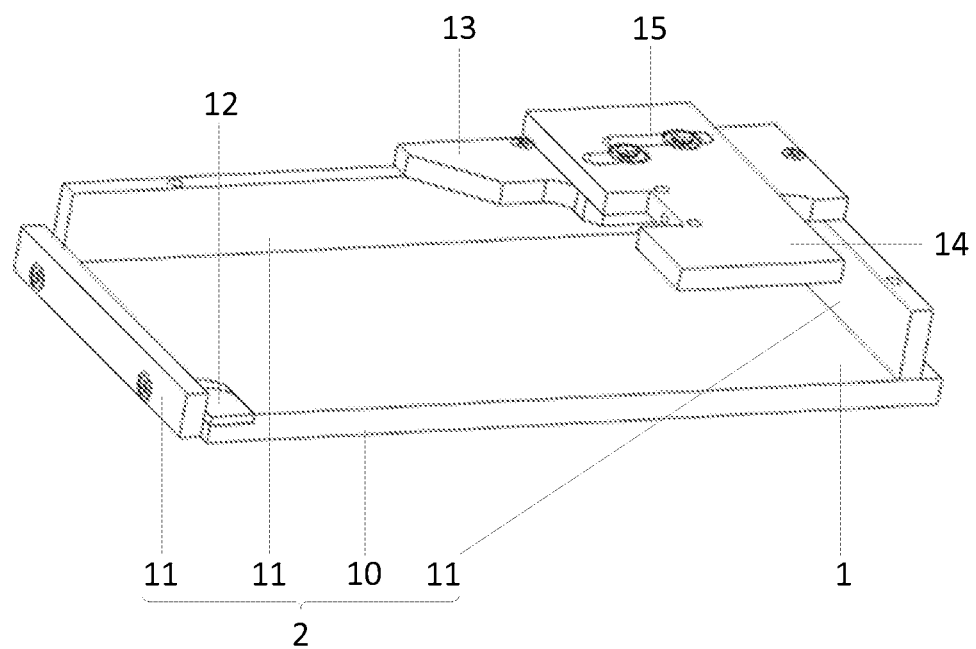
FIG. 4 is a structural schematic diagram of a base provided by an embodiment of the disclosure.

FIG. 4 is a structural schematic diagram of the base provided by an embodiment of the disclosure. As shown in FIG. 4, as an optional embodiment, the base includes a bottom plate 10 and three side plates 11; a surface, being close to the guide assembly, of the bottom plate 10 is the bearing surface 1; and the three side plates 11 are each perpendicular to the bottom plate 10, and the bottom plate 10 and the three side plates 11 are joined to form the limit mechanism 2.

In some embodiments, the bottom plate 10 may be in a shape of a rectangle, and extension directions of the three side plates 11 are respectively parallel to any three side edges of the rectangle, so that the whole base forms a structure that the side plates 11 are located at three sides, and an opening is reserved in one side. When in use, the T-CON board is arranged on the bearing surface 1 of the bottom plate 10 through the opening.

A size of the limit mechanism 2 formed by the joining the bottom plate 10 and the three side plates 11 may be exactly the same as a size of a frame of the T-CON board; and due to this arrangement mode, the position of the T-CON board position can be fixed conveniently, adjustment is not needed, and operation is easy and convenient.

In addition, a conductive block 12 may be arranged on the bottom plate 10, a position of the conductive block 12 is corresponding to a grounding position of the T-CON board; and the conductive block 12 is externally connected to a lead to be grounded so as to prevent the T-CON board from electrostatic breakdown.

With reference to FIG. 1 and FIG. 4, as an optional embodiment, the base further includes a connecting plate 13 and a support plate 14; the connecting plate 13 is fixedly connected to any two adjacent side plates 11; the support plate 14 is positioned on a side, facing away from the bottom plate 10, of the connecting plate 13, is provided with strip-shaped holes 15, and is fixedly connected to the connecting plate 13 by bolts matched with the strip-shaped holes 15; planes where the connecting plate 13 and the support plate 14 are located are both parallel to the bearing surface 1; and the retainer 9 is fixedly installed on the support plate 14.

According to this arrangement mode of embodiments, the retainer 9 is fixedly installed on the support plate 14, the guide rail 7 is installed on the retainer 9, and the fixing plate is fixedly connected to the slider 8, the positions of the probes 5 can be adjusted by adjusting the position of the support plate 14, and the probes 5 can be adjusted to align with the upgrading lead ports of the T-CON board. In addition, in this connection mode, the construction is easy, and the operation and the adjustment are convenient.

As an optional embodiment, the guide assembly further includes a locking mechanism; and the locking mechanism serves to limit displacement of the slider 8 in the direction perpendicular to the bearing surface 1.

In some embodiments, the locking mechanism may be of a structure such as a buckle.

With reference to FIG. 1 and FIG. 3, as an optional embodiment, the locking mechanism includes a first locking block 16 and a second locking block 17; the first locking block 16 is fixedly connected to the slider 8, and is provided with a first magnet 18; the second locking block 17 is fixedly connected to an end, away from the base, of the retainer 9, and is provided with a second magnet 19; and the first magnet 18 and the second magnet 19 are arranged correspondingly.

In some embodiments, before the T-CON board is arranged on the bearing surface 1, the first magnet 18 and the second magnet 19 attract each other, with the slider 8 in a locked state and at a fixed position; in preparation for upgrading, the T-CON board is arranged on the bearing surface 1 firstly and then an operator manually separates the first locking block 16 and the second locking block 17 to bring magnetic forces of the first magnet 18 and the second magnet 19 into contact, at the moment, the blocked state of the slider 8 is contacted, and then the operator can move the slider 8 in the extension direction of the guide rail 7 until the probes 5 are jointed with the upgrading lead ports of the T-CON board.

According to this arrangement mode, the slider 8 can be prevented from sliding off when the T-CON board is arranged, a protection is provided for both the operator and the T-CON board, and smooth upgrading is guaranteed.

Obviously, those skilled in the art can make various modifications and variations to the present application without departing from the spirit and scope of the present application. Thus, the present application is intended to include these modifications and variations if these modifications and variations of the present application fall within the scope of the appended claims and equivalent technologies.

What is claimed is:

1. A fixture for procedural upgrading of a T-CON board, comprising:
    a base comprising a bearing surface for bearing the T-CON board, and a limit mechanism for limiting displacement of the T-CON board in a direction parallel to the bearing surface; and
    a probe assembly for jointing with an upgrading lead port of the T-CON board, the probe assembly being installed on the base and having an adjustable relative position with the bearing surface in a direction perpendicular to the bearing surface;
    wherein the probe assembly comprises a fixing plate and a probe installed on the fixing plate;
    the fixing plate has an adjustable relative position with the bearing surface in the direction perpendicular to the bearing surface; and
    the probe is configured to joint with the upgrading lead port of the T-CON board;
    wherein the fixture further comprises a guide assembly, wherein
    the guide assembly is installed on the base and configured to drive the fixing plate and the probe to move relative to the bearing surface in the direction perpendicular to the bearing surface;
    wherein the guide assembly comprises a guide rail and a slider;
    the slider is fixedly connected to the fixing plate;
    an extension direction of the guide rail is perpendicular to the bearing surface; and
    the slider is installed on the guide rail in a sliding manner in the extension direction of the guide rail;
    wherein the guide assembly further comprises a retainer;
    the retainer is fixedly installed on the base; and
    the guide rail is fixedly installed on the retainer.

2. The fixture according to claim 1, wherein the fixing plate comprises a containing hole for containing the probe; and
    the probe is a telescoping lead probe.

3. The fixture according to claim 1 wherein the base comprises a bottom plate and three side plates;
    a surface, being close to the guide assembly, of the bottom plate is the bearing surface; and
    the three side plates are each perpendicular to the bottom plate, and the bottom plate and the three side plates are joined to form the limit mechanism.

4. The fixture according to claim 3, wherein the guide assembly further comprises a locking mechanism; and
    the locking mechanism is configured to limit displacement of the slider in the direction perpendicular to the bearing surface.

5. The fixture according to claim 3, wherein the base further comprises a connecting plate and a support plate;
    the connecting plate is fixedly connected to any two adjacent side plates;
    the support plate is positioned on a side, facing away from the bottom plate, of the connecting plate, comprises a strip-shaped hole and is fixedly connected to the connecting plate by a bolt matched with the strip-shaped hole;
    planes where the connecting plate and the support plate are located are both parallel to the bearing surface; and
    the retainer is fixedly installed on the support plate.

6. The fixture according to claim 5, wherein the guide assembly further comprises a locking mechanism; and
    the locking mechanism is configured to limit displacement of the slider in the direction perpendicular to the bearing surface.

7. The fixture according to claim 1, wherein the guide assembly further comprises a locking mechanism; and
    the locking mechanism is configured to limit displacement of the slider in the direction perpendicular to the bearing surface.

8. The fixture according to claim 7, wherein the locking mechanism comprises a first locking block and a second locking block;
    the first locking block is fixedly connected to the slider, and comprises a first magnet;
    the second locking block is fixedly connected to an end, away from the base, of the retainer, and comprises a second magnet; and
    the first magnet and the second magnet are arranged correspondingly.

* * * * *

UNITED STATES PATENT AND TRADEMARK OFFICE
CERTIFICATE OF CORRECTION

PATENT NO. : 11,885,831 B2  
APPLICATION NO. : 17/489559  
DATED : January 30, 2024  
INVENTOR(S) : Yingqiu Yang Page 1 of 1

It is certified that error appears in the above-identified patent and that said Letters Patent is hereby corrected as shown below:

On the Title Page

Item (73) should read:  
(73) Assignees: Beijing BOE Chatani Electronics Co., Ltd., Beijing (CN); BOE Technology Group Co., Ltd., Beijing (CN)

Signed and Sealed this  
Twenty-ninth Day of July, 2025

Coke Morgan Stewart  
*Acting Director of the United States Patent and Trademark Office*